United States Patent
An (10) Patent No.: US 7,719,340 B2
(45) Date of Patent: May 18, 2010

(54) INTERNAL VOLTAGE TRIMMING CIRCUIT FOR USE IN A SEMICONDUCTOR MEMORY DEVICE AND METHOD THEREOF

(75) Inventor: Yong-Bok An, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 12/071,426

(22) Filed: Feb. 21, 2008

(65) Prior Publication Data
US 2008/0143420 A1 Jun. 19, 2008

Related U.S. Application Data

(63) Continuation of application No. 11/015,474, filed on Dec. 20, 2004, now Pat. No. 7,352,230.

(51) Int. Cl.
*G06G 7/28* (2006.01)
(52) U.S. Cl. .................................. 327/332; 327/525
(58) Field of Classification Search .................. None
See application file for complete search history.

(56) References Cited

U.S. PATENT DOCUMENTS 5,459,426 A * 10/1995 Hori ........................... 327/332

| 5,550,512 | A | 8/1996 | Fukahori |
| 6,433,714 | B1 | 8/2002 | Clapp et al. |
| 6,909,642 | B2 | 6/2005 | Lehrmann et al. |
| 2004/0108882 | A1 | 6/2004 | Abe |
| 2004/0246045 | A1 * | 12/2004 | Lim et al. .................. 327/540 |

FOREIGN PATENT DOCUMENTS

JP   2001-093296   4/2001
KR   1020010059286   7/2001

OTHER PUBLICATIONS

Katz, Randy H., Contemporary Logic Design, 1994, The Benjamin/Cummings Publishing company, Inc., pp. 296-297 and p. 477-479.*

* cited by examiner

*Primary Examiner*—Lincoln Donovan
*Assistant Examiner*—Khareem E Almo
(74) *Attorney, Agent, or Firm*—Lowe Hauptman Ham & Berner LLP (57) ABSTRACT

An internal power voltage trimming circuit and its method individually or simultaneously perform level trimming for a plurality of power voltages in a semiconductor memory device. The internal power voltage trimming circuit includes a trimming control signal generator for generating a trimming selection signal and a trimming enable signal by using an inputted address signal, and an internal power voltage level controller for controlling the levels of the internal power voltages by using the trimming selection signal that is outputted under control of the trimming enable signal.

20 Claims, 6 Drawing Sheets

INTERNAL VOLTAGE TRIMMING CIRCUIT FOR USE IN A SEMICONDUCTOR MEMORY DEVICE AND METHOD THEREOF

CROSS REFERNCE TO RELATED APPLICATION

This application is a Continuation of U.S. Ser No. 11/015,474, filed on Dec. 20, 2004 now U.S. Pat. No. 7,352,230. This application, in its entirety, is incorporated herein by reference.

FIELD OF INVENTION

The present invention relates to a semiconductor memory device; and, more particularly, to an internal voltage trimming circuit for use in a semiconductor memory device and a method thereof.

DESCRIPTION OF PRIOR ART

In order to reduce current consumption as well as increase operation speed in a semiconductor memory device such as DRAM, a driving voltage has been decreased. From this, a power voltage generator for shifting a power voltage that is applied to the semiconductor memory device to a predetermined level becomes much more important. The power voltage generator generates a first driving voltage VPP for enabling word-lines (WL) of the semiconductor memory device, for example, by using an inputted power voltage VDD. Here, the first driving voltage VPP is higher than the power voltage VDD. On Further, the power voltage generator generates a second driving voltage VBB to apply a bulk bias to NMOS transistors.

On the other hand, the first or second driving voltage from the internal power voltage generator could be higher or lower than a set value depending on environment or condition during manufacturing process of the semiconductor memory device. Such an error can be critical defect in operation of the semiconductor memory device. The error is corrected by fuse cutting depending on variation by using fuse option so as to reduce error. For the fuse cutting, each of the internal power voltages is trimmed to be equal to each of the set values by using a test mode. Then, fuse cutting is performed with selecting a fuse for taking an appropriate level.

On the other hand, when a function test is committed after trimming and fuse cutting, operational condition of the transistor may vary according to manufacture process variation even through the internal power voltages are trimmed as designed. Even there can be insufficient margin in each of the internal power voltages. Further, there can be level discordance between the respective internal power voltages.

Figure 1:
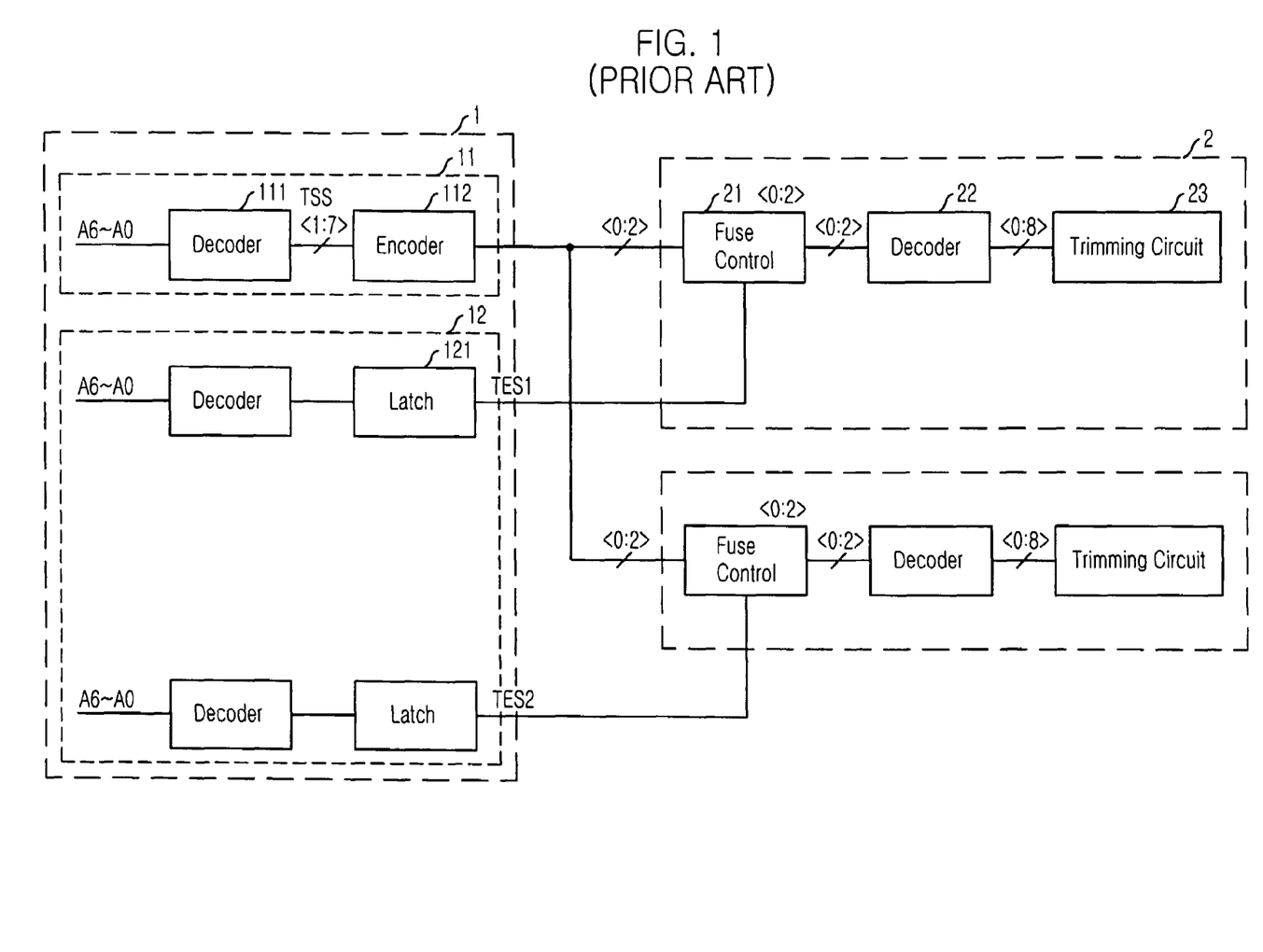
FIG. 1 is a block diagram showing a conventional fuse trimming technique.
Figure 2:
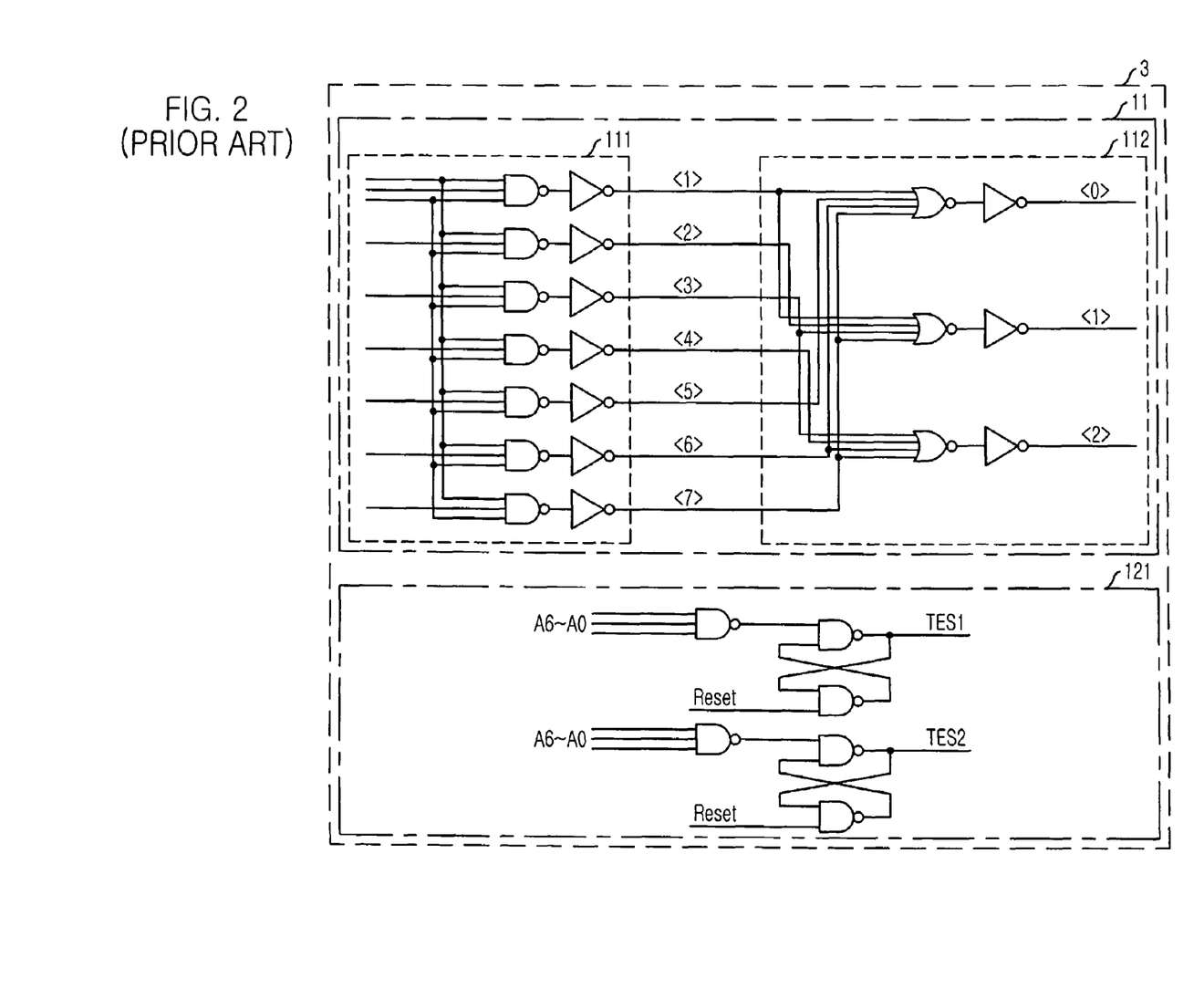
FIG. 2 is a detailed circuit diagram showing a trimming control signal generating unit shown in FIG. 1.
Figure 3:
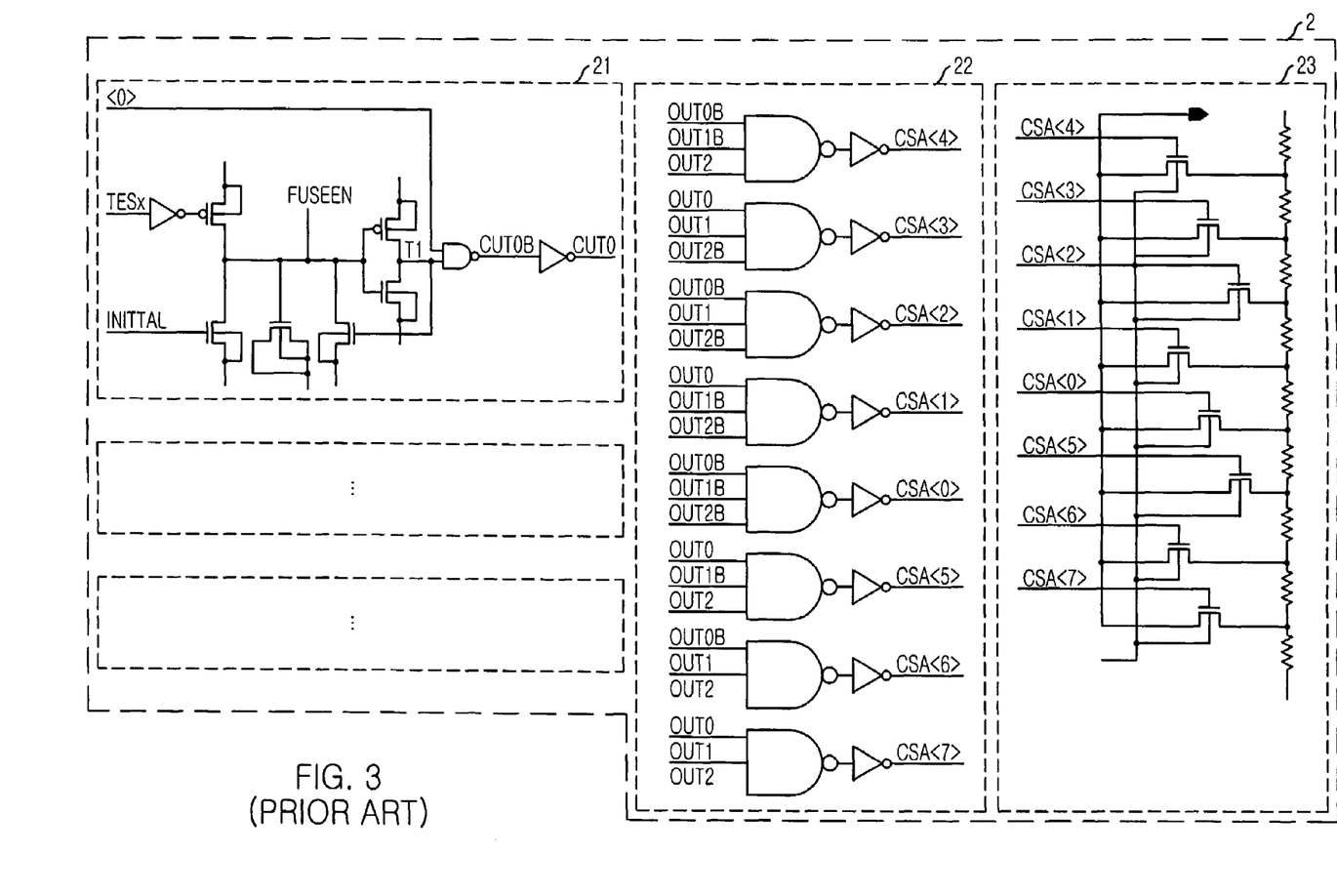
FIG. 3 is a detailed circuit diagram showing an internal voltage level controlling unit shown in FIG. 1.

FIG. 1 is a block diagram showing a conventional fuse trimming technique, in which a case of two power voltages to be trimmed is exemplified. FIG. 2 is a detailed circuit diagram showing a trimming control signal generating unit shown in FIG. 1. FIG. 3 is a detailed circuit diagram showing an internal voltage level controlling unit shown in FIG. 1.

When the semiconductor memory device enters the test mode, a trimming selection signal generating unit decodes an inputted address A6-A0 to output a trimming selection signal TSS and a trimming enable signal generating unit decodes and latches the inputted address A6-A0 to output a first trimming enable signal TES1 and a second trimming enable signal TES2.

The trimming can be selected among 7 cases by using the trimming selection signal TSS that depends on the address A6-A0. For example, a reference level can be increased by 4 steps or decreased by 3 steps. When one of the 7 cases is selected, the previously selected one is disabled.

The first trimming enable signal TES1 and the second trimming enable signal TES2 are enabled or disabled, independently. In other words, in test mode exit, each of latches for the first trimming enable signal TES1 and the second trimming enable signal TES2 is reset when a "L" signal is inputted to a reset port of each of the latches. Further, in test mode entry, first trimming enable signal TES1 and the second trimming enable signal TES2 can also be enabled, simultaneously.

On the other hand, the trimming selection signal TSS and the trimming enable signals cannot be decoded simultaneously. For example, the trimming selection signal TSS is enabled first, and then the trimming selection signal TSS is disabled when either the first trimming enable signal TES1 or the second trimming enable signal TES2 is enabled. Therefore, the trimming selection signal TSS is enabled after first enabling either the first trimming enable signal TES1 or the second trimming enable signal TES2 that is latched for trimming the level of the voltage.

Here, it is necessary to have 7 signal lines for transferring the trimming selection signal to make it possible to have 7 trimming cases depending on the trimming selection signal TSS. Such lines should be connected globally within the semiconductor memory device. As the number of signal lines increases, the size of the semiconductor memory device increases. Accordingly, an encoder 112 encodes the signals on the 7 lines to reduce to signals on 3 lines. The encoded signals are globally transferred from a trimming controlling unit 1 to an internal power voltage level controlling unit 2 and then decoded in a decoder 22 within the internal power voltage level controlling unit 2. The decoded signal makes a switching transistor of a trimming circuit 23 to output the voltage level to be trimmed.

A fuse controlling unit 21 transfers the encoded signal that is inputted when the trimming enable signal TES is enabled. Further, when the fuse is cut in packaged, cutting information of the fuse is blocked and the trimming selection signal TSS is transferred to the decoder 22. At this point, the number of the lines that are outputted from the decoder is 8 while the number of the trimming selections is 7. This is to leave the power voltage level not trimmed but in trimming waiting state by outputting "L" state from the decoder 22 if the trimming selection signal TSS is not inputted even though the first or second trimming enable signal TES1, TES2 is enabled. As such, one power voltage level can be trimmed.

On the other hand, when the first trimming enable signal TES1 and the second trimming enable signal TES2 are enabled with subsequent test mode entry and trimming is selected based on the trimming selection signal TSS, a number of power voltages can be simultaneously level-trimmed to one step. That is, because a number of power voltages cannot be independently trimmed, there is no way to know difference depending on level changes between the power voltages.

SUMMARY OF INVENTION

It is, therefore, an object of the present invention to provide an internal power voltage trimming circuit capable of individually or simultaneously performing level trimming for a plurality of power voltages in a semiconductor memory device.

It is another object of the present invention to provide an internal power voltage trimming method capable of individually or simultaneously performing level trimming for a plurality of power voltages in a semiconductor memory device.

In accordance with an aspect of the present invention, there is provided an internal power voltage trimming circuit for use in an internal power voltage generating circuit for generating a plurality of internal power voltages, including a trimming control signal generating unit for generating a trimming selection signal and a trimming enable signal by using an inputted address signal, and an internal power voltage level controlling unit for controlling the levels of the internal power voltages by using the trimming selection signal that is outputted under control of the trimming enable signal.

In accordance with another aspect of the present invention, there is provided a internal power voltage trimming method for generating a plurality of internal power voltages, comprising the steps of generating a trimming selection signal and a trimming enable signal by using an inputted address signal, and controlling the levels of the internal power voltages by using the trimming selection signal that is outputted under control of the trimming enable signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, an internal power voltage trimming circuit in accordance with the present invention will be described in detail referring to the accompanying drawings.

Figure 4:
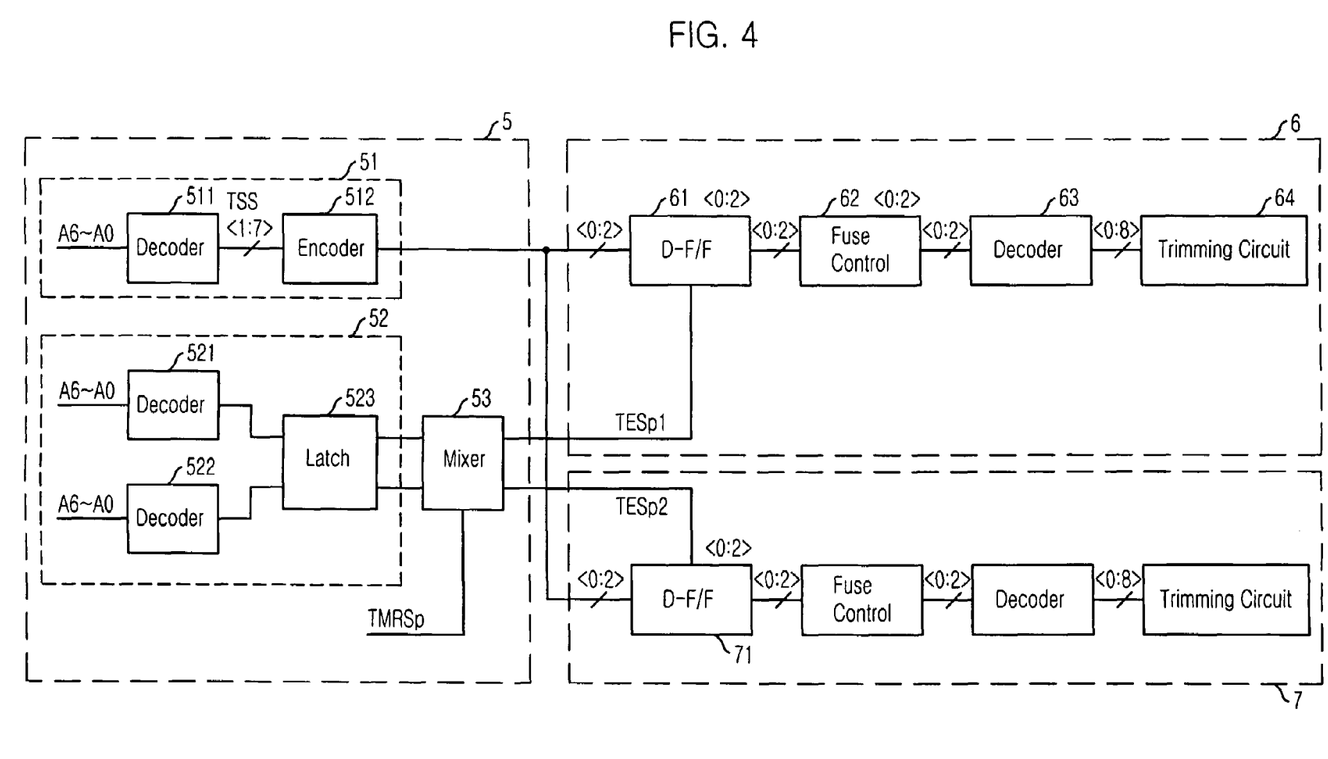
FIG. 4 is a block diagram showing an internal power voltage trimming technique in accordance with a preferred embodiment of the present invention.

FIG. 4 is a block diagram showing an internal power voltage trimming technique in accordance with a preferred embodiment of the present invention.

A trimming selection signal TSS is outputted from a trimming selection signal generating unit 51 to a plurality of internal power voltage level controlling units 6, 7. A latch 523 temporarily stores a first trimming enable signal TES1 and a second trimming enable signal TES2 that are outputted respective decoders 521, 522 to selectively output them. A mixer 53 outputs the first or second trimming enable signal TESp1, TESp2 that is selectively outputted under control of a command TMRSp that is inputted in test mode entry, to latching units 61, 71 in the internal power voltage level controlling units 6, 7. The latching unit 61 is controlled with the first trimming enable signal TESp1 to output a trimming selection signal TSS. On the other hand, a latching unit 71 is controlled with the second trimming enable signal TESp2 to output the trimming selection signal TSS. Here, latching units 61, 71 may be formed in various ways. For example, D F/F, S-R latch or dynamic latch can be used. In the present embodiment, the D F/F is used.

It will be described in detail for operation of detailed circuits that is exemplified according to the embodiment for performing such a function.

Figure 5:
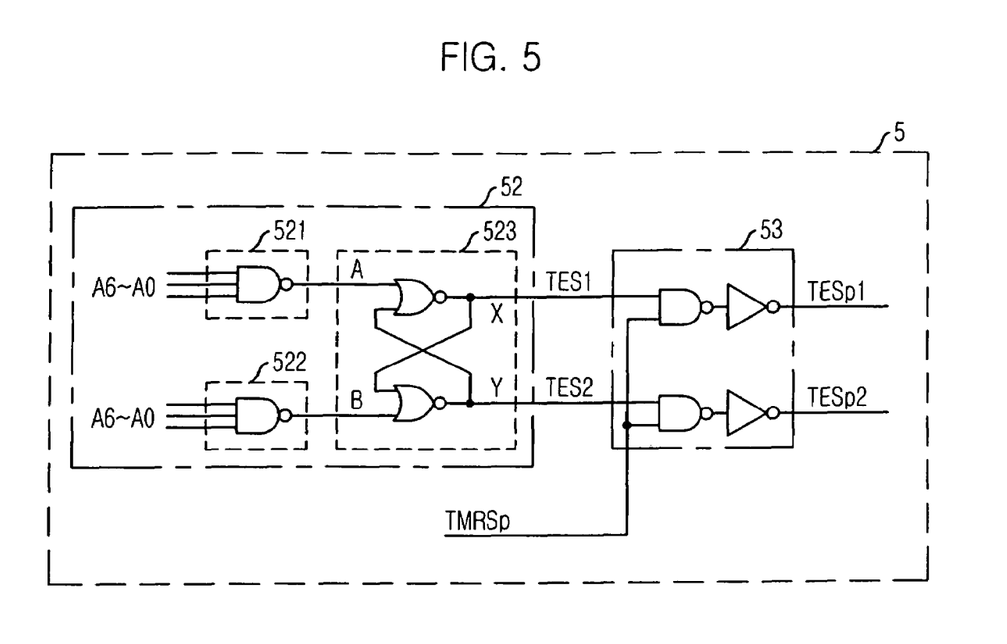
FIG. 5 is a detailed circuit diagram showing a trimming enable signal generating unit shown in FIG. 4.

FIG. 5 is a detailed circuit diagram showing the trimming enable signal generating unit 52 shown in FIG. 4.

The decoders 521, 522 in the trimming enable signal generating unit 52 may be formed with NAND gates. Each of the NAND gates 521, 522 is independently enabled receiving an address A6-A0. The outputs of the NAND gates 521, 522 are inputted to the set input and the reset input of a set-reset(S-R) NOR latch 523, respectively, so that the first trimming enable signal TES1 and the second trimming enable signal TES2 cannot be enabled simultaneously.

Here, the S-R NOR latch 523 operates as represented in the following Table 1.

TABLE 1

| A | B | X | Y |
|---|---|---|---|
| 0 | 0 | Maintain previous state | |
| 0 | 1 | 1 | 0 |
| 1 | 0 | 0 | 1 |
| 1 | 1 | 0 | 0 |

Figure 6:
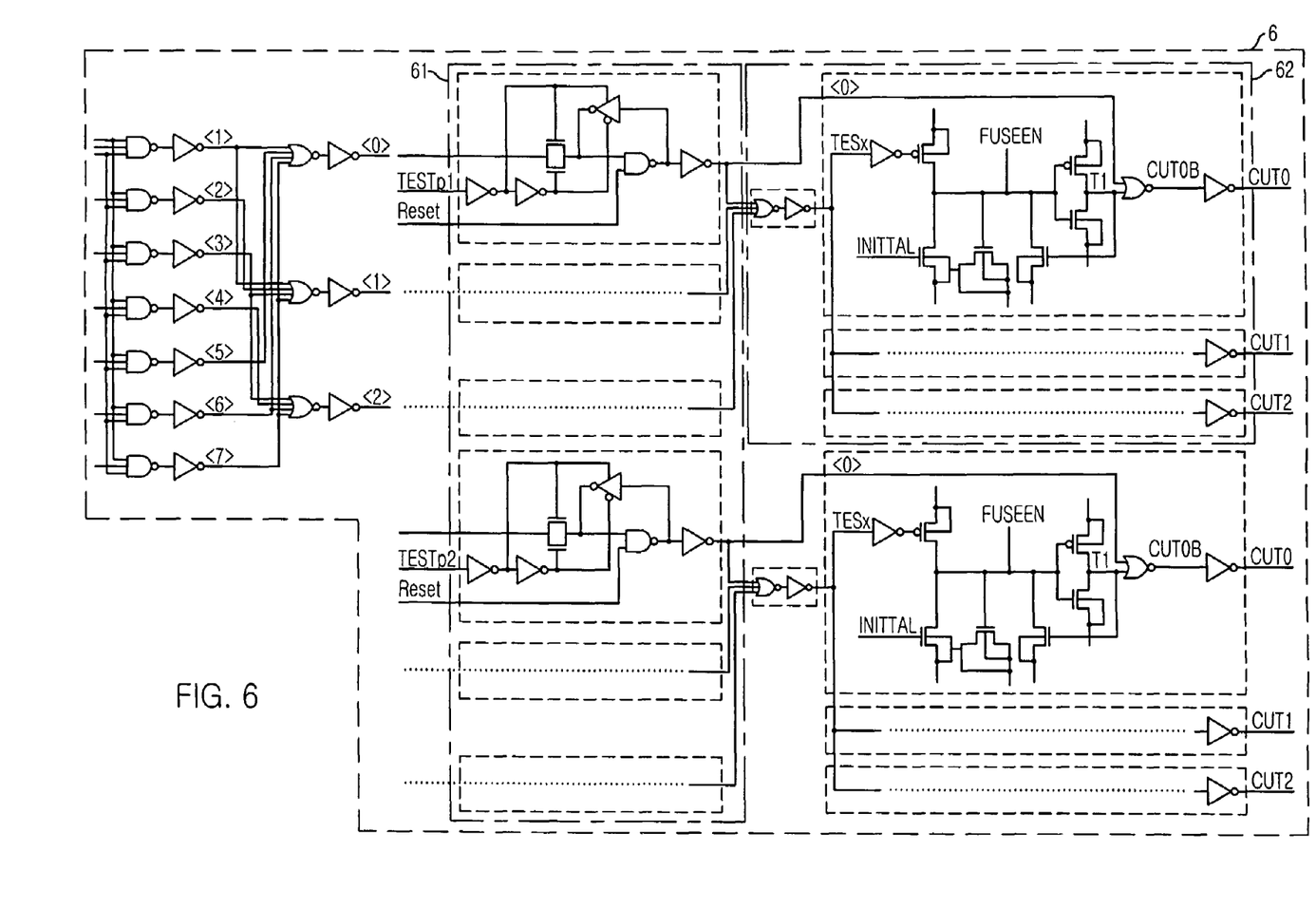
FIG. 6 is a detailed circuit diagram showing an internal power voltage level controlling unit shown in FIG. 4.

FIG. 6 is a detailed circuit diagram showing the internal power voltage level controlling unit 6 shown in FIG. 4.

A D F/F 61 transfers the first trimming enable signal TESp1 from the mixer 53 to output a fuse controlling unit 62 without regard to a logic signal of inputted data. Then, the fuse controlling unit 62 logically combines the output of the D F/F in an OR gate to confirm any trimming selection is made. Such a function is conventionally performed with the first trimming enable signal TES1(or the second trimming enable signal TES2).

Since the first trimming enable signal TES1(or the second trimming enable signal TS2 that is outputted from the latching unit 523 is a latched signal, there is no need to enable it continuously. If any trimming selection signal TSS is again selected so as to trim another voltage level, the D F/F 61 latches the output of the encoder 512 and transfers it to the fuse controlling unit 62. Here, if the D F/F is not reset, the first internal power voltage level is maintained in the previous trimming state. To disable this, it should be exit the test mode.

Further, according to such an operation, when the second trimming enable signal TES2 is enabled while the first internal power voltage level is selected, and any trimming selection signal TSS is enabled, the second internal power voltage level can be trimmed. At this point, the first internal power voltage is maintained. On the other hand, it is apparent to those skilled in the art that the second internal power voltage level can be first trimmed and then the first internal power voltage level can be trimmed.

Here, trimming state of the first and second internal power voltage levels that are level-trimmed in overlapped can be disabled with exiting the test mode.

As described above, optimal internal power voltage condition can be found by independently or substantially simultaneously trimming the levels of the plurality of the internal power voltages. Accordingly, yield can be improved. Further, since function test and DC test can be performed in one trimmed state, test time can be significantly reduced than when tested by separate trimming. Even, since overlapped trimming can be given in addition to independent level trimming, the function test can be performed without fuse cutting, without repetitively performing the function test after fuse cutting for each level of the internal power voltage.

The present application contains subject matter related to the Korean patent application No. KR 2004-75770, filled in the Korean Patent Office on Sep. 22, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An internal power voltage trimming circuit for use in an internal power voltage generating circuit, comprising:
   a trimming control signal generator configured to decode an inputted address signal to generate a trimming selection signal and a plurality of trimming enable signals including a first trimming enable signal and a second trimming enable signal; and
   a plurality of internal power voltage level controllers including a first internal power voltage level controller and a second internal power voltage level controller, each of the plurality of internal power voltage level controllers controlling levels of internal power voltages based on the trimming selection signal and each of the plurality of trimming enable signals,
   wherein the trimming selection signal and the first trimming enable signal are supplied to a first latch of the first internal power voltage level controller, and the trimming selection signal and the second trimming enable signal are supplied to a second latch of the second internal power voltage level controller, and
   wherein the first latch is configured to maintain and output the supplied trimming selection signal and to be reset under control of the first trimming enable signal, and the second latch is configured to maintain and output the supplied trimming selection signal and to be reset under control of the second trimming enable signal.

2. The internal power voltage trimming circuit as recited in claim 1, wherein the trimming control signal generator includes:
   a trimming selection signal generator for generating the trimming selection signal for trimming the internal power voltage levels by using the address signal; and
   a trimming enable signal generator for generating the plurality of trimming enable signal signals for controlling transfer of the trimming selection signal by using the address signal.

3. The internal power voltage trimming circuit as recited in claim 2, wherein the trimming selection signal generator includes:
   a decoder for decoding the address signal; and
   an encoder for encoding the output signal from the decoder to generate the trimming selection signal.

4. The internal power voltage trimming circuit as recited in claim 2, wherein the trimming enable signal generator includes:
   a plurality of decoders connected in parallel to a latch unit and configured to decode the address signal to output the plurality of trimming enable signals, wherein the latch unit is configured to selectively output the plurality of trimming enable signals that are outputted from the plurality of decoders; and
   a mixing unit for outputting the trimming enable signals from the latch unit under control of a test mode entry command.

5. The internal power voltage trimming circuit as recited in claim 4, wherein the plurality of decoders include:
   a first decoder for decoding the address signal to output the first trimming enable signal; and
   a second decoder for decoding the address signal to output the second trimming enable signal.

6. The internal power voltage trimming circuit as recited in claim 5, wherein each of the first latch and the second latch is configured to either maintain a previous state of the trimming selection signal or transfer the trimming selection.

7. The internal power voltage trimming circuit as recited in claim 6, wherein at least one of the first and second latch is formed with a D flip-flop.

8. The internal power voltage trimming circuit as recited in claim 6, wherein at least one of the first and second latch unit is formed with a set-reset latch.

9. The internal power voltage trimming circuit as recited in claim 6, wherein at least one of the first and second latch unit is formed with a dynamic latch.

10. The internal power voltage trimming circuit as recited in claim 5, wherein the decoder is formed with a NAND gate receiving the address signal.

11. The internal power voltage trimming circuit as recited in claim 5, wherein the latch unit includes a first NOR gate and a second NOR gate, the first NOR gate receiving the output of the first decoder and the output of the second NOR gate and the second NOR gate receiving the output of the second decoder and the output of the first NOR gate.

12. The internal power voltage trimming circuit as recited in claim 11, wherein the mixing unit includes:
    a first NAND gate receiving the output of the first NOR gate and the test mode entry command; and
    a second NAND gate receiving the output of the second NOR gate and the test mode entry command.

13. An internal power voltage trimming method of generating a plurality of internal power voltages, comprising the steps of:
    generating a trimming selection signal and a plurality of trimming enable signals including a first and second trimming enable signal, based on an inputted address signal;
    supplying the first and second trimming enable signal to a latch unit, wherein one of the first and second trimming enable signal is selectively enabled by the latch unit;
    supplying the trimming selection signal and the selectively-enabled first trimming enable signal to a first latch and supplying the trimming selection signal and the selectively-enabled second trimming enable signal to a second latch, wherein the first latch is configured to maintain and output the supplied trimming selection signal and to be reset under control of the first trimming enable signal, and the second latch is configured to maintain and output the supplied trimming selection signal and to be reset under control of the second trimming enable signal; and
    controlling the levels of the internal power voltages based on the trimming selection signal and the plurality of trimming enable signals.

14. The internal power voltage trimming method as recited in claim 13, wherein the trimming selection and enable signals generating step includes the steps of:
    generating the trimming selection signal for trimming the levels of the internal power voltages by using the address signal; and
    generating the plurality of trimming enable signals for controlling the transfer of the trimming selection signal by using the address signal.

15. The internal power voltage trimming method as recited in claim 14, wherein the trimming selection signal generating step includes the steps of:
  decoding the address signal; and
  encoding the decoded address signal to output the trimming selection signal.

16. The internal power voltage trimming method as recited in claim 14, wherein the trimming enable signal generating step includes the steps of:
  decoding the address signal to output the plurality of trimming enable signals;
  selectively outputting the plurality of the trimming enable signals; and
  outputting the trimming enable signal under control of an external test mode entry command.

17. The internal power voltage trimming method as recited in claim 16, wherein the internal power voltage level controlling step includes the step of outputting the trimming selection signal under control of one of the plurality of trimming enable signal.

18. The internal power voltage trimming method as recited in claim 13, wherein each of the first latch and the second latch is configured to either maintain a previous state of the trimming selection signal or transfer the trimming selection.

19. The internal power voltage trimming circuit according to claim 4, wherein the latch unit is configured to transfer one of the plurality of trimming enable signals to the mixing unit that is configured to transfer the plurality of trimming enable signals to the plurality of internal power voltage level controllers.

20. An internal power voltage trimming circuit for use in an internal power voltage generating circuit, comprising:
  a trimming control signal generator including:
    a trimming selection signal generator configured to decode an inputted address signal to generate a trimming selection signal; and
    a trimming enable signal generator configured to decode the inputted address to generate a plurality of trimming enable signals including a first trimming enable signal and a second trimming enable signal; and
  a plurality of internal power voltage level controllers including a first internal power voltage level controller and a second internal power voltage level controller, each of the plurality of internal power voltage level controllers controlling internal power voltage levels based on the trimming selection signal and each of the plurality of trimming enable signals,
wherein the trimming enable signal generator comprises:
a first decoder for decoding the address signal to output the first trimming enable signal;
a second decoder for decoding the address signal to output the second trimming enable signal; and
a latch unit for receiving the first trimming enable signal and the second trimming enable signal and for selectively outputting either of the first trimming enable signal and the second trimming enable signal to either of the first internal power voltage level controller and the second internal power voltage controller at a time.

* * * * *